United States Patent [19]

Jedwab

[11] Patent Number: 5,778,013
[45] Date of Patent: Jul. 7, 1998

[54] METHOD AND APPARATUS FOR VERIFYING CRC CODES

[75] Inventor: Jonathan Jedwab, Clifton, England

[73] Assignee: Hewlett-Packard Company, Palo Alto, Calif.

[21] Appl. No.: 584,804

[22] Filed: Jan. 11, 1996

Related U.S. Application Data

[63] Continuation of Ser. No. 189,319, Jan. 31, 1994, abandoned.

[30] Foreign Application Priority Data

Feb. 5, 1993 [EP]  European Pat. Off. ............ 93300852

[51] Int. Cl.$^6$ .......................... G06F 11/10; H03M 13/00
[52] U.S. Cl. ............................................. 371/53
[58] Field of Search ...................... 371/30, 35, 37.7, 371/53, 37.1, 48, 49.1, 49.2; 364/265.1; 370/99, 405.1, 242

[56] References Cited

U.S. PATENT DOCUMENTS

| | | | |
|---|---|---|---|
| 4,703,485 | 10/1987 | Patel | 371/37.1 |
| 4,910,736 | 3/1990 | Tanaka et al. | 371/37.7 |
| 4,933,969 | 6/1990 | Marshall | 380/29 |
| 5,303,302 | 4/1994 | Burrows | 380/49 |
| 5,321,704 | 6/1994 | Erickson et al. | 371/37.1 |
| 5,361,266 | 11/1994 | Kodama et al. | 371/37.7 |
| 5,410,546 | 4/1995 | Boyer et al. | 371/37.1 |

FOREIGN PATENT DOCUMENTS

| | | | |
|---|---|---|---|
| 0233075 | 8/1987 | European Pat. Off. | H03M 13/00 |
| 0465006 | 1/1992 | European Pat. Off. | G06F 11/08 |

OTHER PUBLICATIONS

*IBM Technical Disclosure Bulletin*, vol. 30, No. 12, May 1988, New York US pp. 458–464, XP22467 'Method to provide software calculation of a 32–bit frame check sequence, a byte at a time'.

*Computer Networks and ISDN Systems*, vol. 24, No. 2, Apr. 1992, Amsterdam NL pp. 109–118, XP257845 Birch et al 'A programmable 800 Mbits/s CRC check/generator unit for LAN's and MAN's'.

*IEEE Micro*, vol. 10, No. 5, Oct. 1990, New York US pp. 63–71, XP170678 Albertengo et al 'Parallel crc generation'.

IBM Technical Disclosure Bulletin, vol. 15 No. 4, Sep. 1972 "Parallel CRC Generation for Multilength Characters" P.E. Boudreau, et al pp. 1314–1315.

*Primary Examiner*—Albert Décady

[57] ABSTRACT

Apparatus for verifying a CRC code of a message transmitted as a succession of sub-blocks comprises dedicated hardware including a linear feedback shift register for deriving a 'partial' CRC code for each individual sub-block. These partial CRC codes are held in a store for subsequent combination under software program control. The combination is performed in a iterative manner, each partial CRC code being added modulo 2 to values selected from look-up tables in accordance with the result of the previous step of the iteration. The division of the CRC verification into two operations and the use of precalculated look-up tables facilitate the efficient, simultaneous reception of many messages having interleaved sub-blocks without incurring serious time penalties.

9 Claims, 10 Drawing Sheets

Fig. 4a: T$_{384}$[00-7F]

| | | |
|---|---|---|
| t[00] = 00000000 | t[2B] = 2D998414 | t[56] = 5B330828 |
| t[01] = 8C3828A8 | t[2C] = 84727995 | t[57] = D70B2080 |
| t[02] = 1CB14CE7 | t[2D] = 084A513D | t[58] = 0C25EE9D |
| t[03] = 9089644F | t[2E] = 98C33572 | t[59] = 801DC635 |
| t[04] = 396299CE | t[2F] = 14FB1DDA | t[5A] = 1094A27A |
| t[05] = B55AB166 | t[30] = 2A5FB4FF | t[5B] = 9CAC8AD2 |
| t[06] = 25D3D529 | t[31] = A6679C57 | t[5C] = 35477753 |
| t[07] = A9EBFD81 | t[32] = 36EEF818 | t[5D] = B97F5FFB |
| t[08] = 72C5339C | t[33] = BAD6D0B0 | t[5E] = 29F63BB4 |
| t[09] = FEFD1B34 | t[34] = 133D2D31 | t[5F] = A5CE131C |
| t[0A] = 6E747F7B | t[35] = 9F050599 | t[60] = 54BF69FE |
| t[0B] = E24C57D3 | t[36] = 0F8C61D6 | t[61] = D8874156 |
| t[0C] = 4BA7AA52 | t[37] = 83B4497E | t[62] = 480E2519 |
| t[0D] = C79F82FA | t[38] = 589A8763 | t[63] = C4360DB1 |
| t[0E] = 5716E6B5 | t[39] = D4A2AFCB | t[64] = 6DDDF030 |
| t[0F] = DB2ECE1D | t[3A] = 442BCB84 | t[65] = E1E5D898 |
| t[10] = E58A6738 | t[3B] = C813E32C | t[66] = 716CBCD7 |
| t[11] = 69B24F90 | t[3C] = 61F81EAD | t[67] = FD54947F |
| t[12] = F93B2BDF | t[3D] = EDC03605 | t[68] = 267A5A62 |
| t[13] = 75030377 | t[3E] = 7D49524A | t[69] = AA4272CA |
| t[14] = DCE8FEF6 | t[3F] = F1717AE2 | t[6A] = 3ACB1685 |
| t[15] = 50D0D65E | t[40] = 9B6ABA39 | t[6B] = B6F33E2D |
| t[16] = C059B211 | t[41] = 17529291 | t[6C] = 1F18C3AC |
| t[17] = 4C619AB9 | t[42] = 87DBF6DE | t[6D] = 9320EB04 |
| t[18] = 974F54A4 | t[43] = 0BE3DE76 | t[6E] = 03A98F4B |
| t[19] = 1B777C0C | t[44] = A20823F7 | t[6F] = 8F91A7E3 |
| t[1A] = 8BFE1843 | t[45] = 2E300B5F | t[70] = B1350EC6 |
| t[1B] = 07C630EB | t[46] = BEB96F10 | t[71] = 3D0D266E |
| t[1C] = AE2DCD6A | t[47] = 328147B8 | t[72] = AD844221 |
| t[1D] = 2215E5C2 | t[48] = E9AF89A5 | t[73] = 21BC6A89 |
| t[1E] = B29C818D | t[49] = 6597A10D | t[74] = 88579708 |
| t[1F] = 3EA4A925 | t[4A] = F51EC542 | t[75] = 046FBFA0 |
| t[20] = CFD5D3C7 | t[4B] = 7926EDEA | t[76] = 94E6DBEF |
| t[21] = 43EDFB6F | t[4C] = D0CD106B | t[77] = 18DEF347 |
| t[22] = D3649F20 | t[4D] = 5CF538C3 | t[78] = C3F03D5A |
| t[23] = 5F5CB788 | t[4E] = CC7C5C8C | t[79] = 4FC815F2 |
| t[24] = F6B74A09 | t[4F] = 40447424 | t[7A] = DF4171BD |
| t[25] = 7A8F62A1 | t[50] = 7EE0DD01 | t[7B] = 53795915 |
| t[26] = EA0606EE | t[51] = F2D8F5A9 | t[7C] = FA92A494 |
| t[27] = 663E2E46 | t[52] = 625191E6 | t[7D] = 76AA8C3C |
| t[28] = BD10E05B | t[53] = EE69B94E | t[7E] = E623E873 |
| t[29] = 3128C8F3 | t[54] = 478244CF | t[7F] = 6A1BC0DB |
| t[2A] = A1A1ACBC | t[55] = CBBA6C67 | |

Fig. 4b: $T_{384}$[80-FF]

| | | |
|---|---|---|
| t[80] = 321469C5 | t[AB] = 1F8DEDD1 | t[D6] = 692761ED |
| t[81] = BE2C416D | t[AC] = B6661050 | t[D7] = E51F4945 |
| t[82] = 2EA52522 | t[AD] = 3A5E38F8 | t[D8] = 3E318758 |
| t[83] = A29D0D8A | t[AE] = AAD75CB7 | t[D9] = B209AFF0 |
| t[84] = 0B76F00B | t[AF] = 26EF741F | t[DA] = 2280CBBF |
| t[85] = 874ED8A3 | t[B0] = 184BDD3A | t[DB] = AEB8E317 |
| t[86] = 17C7BCEC | t[B1] = 9473F592 | t[DC] = 07531E96 |
| t[87] = 9BFF9444 | t[B2] = 04FA91DD | t[DD] = 8B6B363E |
| t[88] = 40D15A59 | t[B3] = 88C2B975 | t[DE] = 1BE25271 |
| t[89] = CCE972F1 | t[B4] = 212944F4 | t[DF] = 97DA7AD9 |
| t[8A] = 5C6016BE | t[B5] = AD116C5C | t[E0] = 66AB003B |
| t[8B] = D0583E16 | t[B6] = 3D980813 | t[E1] = EA932893 |
| t[8C] = 79B3C397 | t[B7] = B1A020BB | t[E2] = 7A1A4CDC |
| t[8D] = F58BEB3F | t[B8] = 6A8EEEA6 | t[E3] = F6226474 |
| t[8E] = 65028F70 | t[B9] = E6B6C60E | t[E4] = 5FC999F5 |
| t[8F] = E93AA7D8 | t[BA] = 763FA241 | t[E5] = D3F1B15D |
| t[90] = D79E0EFD | t[BB] = FA078AE9 | t[E6] = 4378D512 |
| t[91] = 5BA62655 | t[BC] = 53EC7768 | t[E7] = CF40FDBA |
| t[92] = CB2F421A | t[BD] = DFD45FC0 | t[E8] = 146E33A7 |
| t[93] = 47176AB2 | t[BE] = 4F5D3B8F | t[E9] = 98561B0F |
| t[94] = EEFC9733 | t[BF] = C3651327 | t[EA] = 08DF7F40 |
| t[95] = 62C4BF9B | t[C0] = A97ED3FC | t[EB] = 84E757E8 |
| t[96] = F24DDBD4 | t[C1] = 2546FB54 | t[EC] = 2D0CAA69 |
| t[97] = 7E75F37C | t[C2] = B5CF9F1B | t[ED] = A13482C1 |
| t[98] = A55B3D61 | t[C3] = 39F7B7B3 | t[EE] = 31BDE68E |
| t[99] = 296315C9 | t[C4] = 901C4A32 | t[EF] = BD85CE26 |
| t[9A] = B9EA7186 | t[C5] = 1C24629A | t[F0] = 83216703 |
| t[9B] = 35D2592E | t[C6] = 8CAD06D5 | t[F1] = 0F194FAB |
| t[9C] = 9C39A4AF | t[C7] = 00952E7D | t[F2] = 9F902BE4 |
| t[9D] = 10018C07 | t[C8] = DBBBE060 | t[F3] = 13A8034C |
| t[9E] = 8088E848 | t[C9] = 5783C8C8 | t[F4] = BA43FECD |
| t[9F] = 0CB0C0E0 | t[CA] = C70AAC87 | t[F5] = 367BD665 |
| t[A0] = FDC1BA02 | t[CB] = 4B32842F | t[F6] = A6F2B22A |
| t[A1] = 71F992AA | t[CC] = E2D979AE | t[F7] = 2ACA9A82 |
| t[A2] = E170F6E5 | t[CD] = 6EE15106 | t[F8] = F1E4549F |
| t[A3] = 6D48DE4D | t[CE] = FE683549 | t[F9] = 7DDC7C37 |
| t[A4] = C4A323CC | t[CF] = 72501DE1 | t[FA] = ED551878 |
| t[A5] = 489B0B64 | t[D0] = 4CF4B4C4 | t[FB] = 616D30D0 |
| t[A6] = D8126F2B | t[D1] = C0CC9C6C | t[FC] = C886CD51 |
| t[A7] = 542A4783 | t[D2] = 5045F823 | t[FD] = 44BEE5F9 |
| t[A8] = 8F04899E | t[D3] = DC7DD08B | t[FE] = D43781B6 |
| t[A9] = 033CA136 | t[D4] = 75962D0A | t[FF] = 580FA91E |
| t[AA] = 93B5C579 | t[D5] = F9AE05A2 | |

Fig. 5a: T₃₉₂[00-7F]

| | | |
|---|---|---|
| t[00] = 00000000 | t[2B] = 306A2433 | t[56] = 60D44866 |
| t[01] = 6428D38A | t[2C] = 08710332 | t[57] = 04FC9BEC |
| t[02] = C851A714 | t[2D] = 6C59D0B8 | t[58] = 10E20664 |
| t[03] = AC79749E | t[2E] = C020A426 | t[59] = 74CAD5EE |
| t[04] = 9462539F | t[2F] = A40877AC | t[5A] = D8B3A170 |
| t[05] = F04A8015 | t[30] = E81D9F36 | t[5B] = BC9B72FA |
| t[06] = 5C33F48B | t[31] = 8C354CBC | t[5C] = 848055FB |
| t[07] = 381B2701 | t[32] = 204C3822 | t[5D] = E0A88671 |
| t[08] = 2C05BA89 | t[33] = 4464EBA8 | t[5E] = 4CD1F2EF |
| t[09] = 482D6903 | t[34] = 7C7FCCA9 | t[5F] = 28F92165 |
| t[0A] = E4541D9D | t[35] = 18571F23 | t[60] = D4FA23DB |
| t[0B] = 807CCE17 | t[36] = B42E6BBD | t[61] = B0D2F051 |
| t[0C] = B867E916 | t[37] = D006B837 | t[62] = 1CAB84CF |
| t[0D] = DC4F3A9C | t[38] = C41825BF | t[63] = 78835745 |
| t[0E] = 70364E02 | t[39] = A030F635 | t[64] = 40987044 |
| t[0F] = 141E9D88 | t[3A] = 0C4982AB | t[65] = 24B0A3CE |
| t[10] = 580B7512 | t[3B] = 68615121 | t[66] = 88C9D750 |
| t[11] = 3C23A698 | t[3C] = 507A7620 | t[67] = ECE104DA |
| t[12] = 905AD206 | t[3D] = 3452A5AA | t[68] = F8FF9952 |
| t[13] = F472018C | t[3E] = 982BD134 | t[69] = 9CD74AD8 |
| t[14] = CC69268D | t[3F] = FC0302BE | t[6A] = 30AE3E46 |
| t[15] = A841F507 | t[40] = 64ECC9FF | t[6B] = 5486EDCC |
| t[16] = 04388199 | t[41] = 00C41A75 | t[6C] = 6C9DCACD |
| t[17] = 60105213 | t[42] = ACBD6EEB | t[6D] = 08B51947 |
| t[18] = 740ECF9B | t[43] = C895BD61 | t[6E] = A4CC6DD9 |
| t[19] = 10261C11 | t[44] = F08E9A60 | t[6F] = C0E4BE53 |
| t[1A] = BC5F688F | t[45] = 94A649EA | t[70] = 8CF156C9 |
| t[1B] = D877BB05 | t[46] = 38DF3D74 | t[71] = E8D98543 |
| t[1C] = E06C9C04 | t[47] = 5CF7EEFE | t[72] = 44A0F1DD |
| t[1D] = 84444F8E | t[48] = 48E97376 | t[73] = 20882257 |
| t[1E] = 283D3B10 | t[49] = 2CC1A0FC | t[74] = 18930556 |
| t[1F] = 4C15E89A | t[4A] = 80B8D462 | t[75] = 7CBBD6DC |
| t[20] = B016EA24 | t[4B] = E49007E8 | t[76] = D0C2A242 |
| t[21] = D43E39AE | t[4C] = DC8B20E9 | t[77] = B4EA71C8 |
| t[22] = 78474D30 | t[4D] = B8A3F363 | t[78] = A0F4EC40 |
| t[23] = 1C6F9EBA | t[4E] = 14DA87FD | t[79] = C4DC3FCA |
| t[24] = 2474B9BB | t[4F] = 70F25477 | t[7A] = 68A54B54 |
| t[25] = 405C6A31 | t[50] = 3CE7BCED | t[7B] = 0C8D98DE |
| t[26] = EC251EAF | t[51] = 58CF6F67 | t[7C] = 3496BFDF |
| t[27] = 880DCD25 | t[52] = F4B61BF9 | t[7D] = 50BE6C55 |
| t[28] = 9C1350AD | t[53] = 909EC873 | t[7E] = FCC718CB |
| t[29] = F83B8327 | t[54] = A885EF72 | t[7F] = 98EFCB41 |
| t[2A] = 5442F7B9 | t[55] = CCAD3CF8 | |

Fig. 5b: $T_{392}$[80-FF]

| | | |
|---|---|---|
| t[80] = C9D993FE | t[AB] = F9B3B7CD | t[D6] = A90DDB98 |
| t[81] = ADF14074 | t[AC] = C1A890CC | t[D7] = CD250812 |
| t[82] = 018834EA | t[AD] = A5804346 | t[D8] = D93B959A |
| t[83] = 65A0E760 | t[AE] = 09F937D8 | t[D9] = BD134610 |
| t[84] = 5DBBC061 | t[AF] = 6DD1E452 | t[DA] = 116A328E |
| t[85] = 399313EB | t[B0] = 21C40CC8 | t[DB] = 7542E104 |
| t[86] = 95EA6775 | t[B1] = 45ECDF42 | t[DC] = 4D59C605 |
| t[87] = F1C2B4FF | t[B2] = E995ABDC | t[DD] = 2971158F |
| t[88] = E5DC2977 | t[B3] = 8DBD7856 | t[DE] = 85086111 |
| t[89] = 81F4FAFD | t[B4] = B5A65F57 | t[DF] = E120B29B |
| t[8A] = 2D8D8E63 | t[B5] = D18E8CDD | t[E0] = 1D23B025 |
| t[8B] = 49A55DE9 | t[B6] = 7DF7F843 | t[E1] = 790B63AF |
| t[8C] = 71BE7AE8 | t[B7] = 19DF2BC9 | t[E2] = D5721731 |
| t[8D] = 1596A962 | t[B8] = 0DC1B641 | t[E3] = B15AC4BB |
| t[8E] = B9EFDDFC | t[B9] = 69E965CB | t[E4] = 8941E3BA |
| t[8F] = DDC70E76 | t[BA] = C5901155 | t[E5] = ED693030 |
| t[90] = 91D2E6EC | t[BB] = A1B8C2DF | t[E6] = 411044AE |
| t[91] = F5FA3566 | t[BC] = 99A3E5DE | t[E7] = 25389724 |
| t[92] = 598341F8 | t[BD] = FD8B3654 | t[E8] = 31260AAC |
| t[93] = 3DAB9272 | t[BE] = 51F242CA | t[E9] = 550ED926 |
| t[94] = 05B0B573 | t[BF] = 35DA9140 | t[EA] = F977ADB8 |
| t[95] = 619866F9 | t[C0] = AD355A01 | t[EB] = 9D5F7E32 |
| t[96] = CDE11267 | t[C1] = C91D898B | t[EC] = A5445933 |
| t[97] = A9C9C1ED | t[C2] = 6564FD15 | t[ED] = C16C8AB9 |
| t[98] = BDD75C65 | t[C3] = 014C2E9F | t[EE] = 6D15FE27 |
| t[99] = D9FF8FEF | t[C4] = 3957099E | t[EF] = 093D2DAD |
| t[9A] = 7586FB71 | t[C5] = 5D7FDA14 | t[F0] = 4528C537 |
| t[9B] = 11AE28FB | t[C6] = F106AE8A | t[F1] = 210016BD |
| t[9C] = 29B50FFA | t[C7] = 952E7D00 | t[F2] = 8D796223 |
| t[9D] = 4D9DDC70 | t[C8] = 8130E088 | t[F3] = E951B1A9 |
| t[9E] = E1E4A8EE | t[C9] = E5183302 | t[F4] = D14A96A8 |
| t[9F] = 85CC7B64 | t[CA] = 4961479C | t[F5] = B5624522 |
| t[A0] = 79CF79DA | t[CB] = 2D499416 | t[F6] = 191B31BC |
| t[A1] = 1DE7AA50 | t[CC] = 1552B317 | t[F7] = 7D33E236 |
| t[A2] = B19EDECE | t[CD] = 717A609D | t[F8] = 692D7FBE |
| t[A3] = D5B60D44 | t[CE] = DD031403 | t[F9] = 0D05AC34 |
| t[A4] = EDAD2A45 | t[CF] = B92BC789 | t[FA] = A17CD8AA |
| t[A5] = 8985F9CF | t[D0] = F53E2F13 | t[FB] = C5540B20 |
| t[A6] = 25FC8D51 | t[D1] = 9116FC99 | t[FC] = FD4F2C21 |
| t[A7] = 41D45EDB | t[D2] = 3D6F8807 | t[FD] = 9967FFAB |
| t[A8] = 55CAC353 | t[D3] = 59475B8D | t[FE] = 351E8B35 |
| t[A9] = 31E210D9 | t[D4] = 615C7C8C | t[FF] = 513658BF |
| t[AA] = 9D9B6447 | t[D5] = 0574AF06 | |

Fig. 6a: $T_{400}$[00-7F]

| | | |
|---|---|---|
| t[00] = 00000000 | t[2B] = BE165E90 | t[56] = 78EDA097 |
| t[01] = 97723A4B | t[2C] = 570BDFB8 | t[57] = EF9F9ADC |
| t[02] = 2A256921 | t[2D] = C079E5F3 | t[58] = AE17BF70 |
| t[03] = BD57536A | t[2E] = 7D2EB699 | t[59] = 3965853B |
| t[04] = 544AD242 | t[2F] = EA5C8CD2 | t[5A] = 8432D651 |
| t[05] = C338E809 | t[30] = FE3EFDC1 | t[5B] = 1340EC1A |
| t[06] = 7E6FBB63 | t[31] = 694CC78A | t[5C] = FA5D6D32 |
| t[07] = E91D8128 | t[32] = D41B94E0 | t[5D] = 6D2F5779 |
| t[08] = A895A484 | t[33] = 4369AEAB | t[5E] = D0780413 |
| t[09] = 3FE79ECF | t[34] = AA742F83 | t[5F] = 470A3E58 |
| t[0A] = 82B0CDA5 | t[35] = 3D0615C8 | t[60] = F8BCE635 |
| t[0B] = 15C2F7EE | t[36] = 805146A2 | t[61] = 6FCEDC7E |
| t[0C] = FCDF76C6 | t[37] = 17237CE9 | t[62] = D2998F14 |
| t[0D] = 6BAD4C8D | t[38] = 56AB5945 | t[63] = 45EBB55F |
| t[0E] = D6FA1FE7 | t[39] = C1D9630E | t[64] = ACF63477 |
| t[0F] = 418825AC | t[3A] = 7C8E3064 | t[65] = 3B840E3C |
| t[10] = 55EA54BF | t[3B] = EBFC0A2F | t[66] = 86D35D56 |
| t[11] = C2986EF4 | t[3C] = 02E18B07 | t[67] = 11A1671D |
| t[12] = 7FCF3D9E | t[3D] = 9593B14C | t[68] = 502942B1 |
| t[13] = E8BD07D5 | t[3E] = 28C4E226 | t[69] = C75B78FA |
| t[14] = 01A086FD | t[3F] = BFB6D86D | t[6A] = 7A0C2B90 |
| t[15] = 96D2BCB6 | t[40] = 53684F4B | t[6B] = ED7E11DB |
| t[16] = 2B85EFDC | t[41] = C41A7500 | t[6C] = 046390F3 |
| t[17] = BCF7D597 | t[42] = 794D266A | t[6D] = 9311AAB8 |
| t[18] = FD7FF03B | t[43] = EE3F1C21 | t[6E] = 2E46F9D2 |
| t[19] = 6A0DCA70 | t[44] = 07229D09 | t[6F] = B934C399 |
| t[1A] = D75A991A | t[45] = 9050A742 | t[70] = AD56B28A |
| t[1B] = 4028A351 | t[46] = 2D07F428 | t[71] = 3A2488C1 |
| t[1C] = A9352279 | t[47] = BA75CE63 | t[72] = 8773DBAB |
| t[1D] = 3E471832 | t[48] = FBFDEBCF | t[73] = 1001E1E0 |
| t[1E] = 83104B58 | t[49] = 6C8FD184 | t[74] = F91C60C8 |
| t[1F] = 14627113 | t[4A] = D1D882EE | t[75] = 6E6E5A83 |
| t[20] = ABD4A97E | t[4B] = 46AAB8A5 | t[76] = D33909E9 |
| t[21] = 3CA69335 | t[4C] = AFB7398D | t[77] = 444B33A2 |
| t[22] = 81F1C05F | t[4D] = 38C503C6 | t[78] = 05C3160E |
| t[23] = 1683FA14 | t[4E] = 859250AC | t[79] = 92B12C45 |
| t[24] = FF9E7B3C | t[4F] = 12E06AE7 | t[7A] = 2FE67F2F |
| t[25] = 68EC4177 | t[50] = 06821BF4 | t[7B] = B8944564 |
| t[26] = D5BB121D | t[51] = 91F021BF | t[7C] = 5189C44C |
| t[27] = 42C92856 | t[52] = 2CA772D5 | t[7D] = C6FBFE07 |
| t[28] = 03410DFA | t[53] = BBD5489E | t[7E] = 7BACAD6D |
| t[29] = 943337B1 | t[54] = 52C8C9B6 | t[7F] = ECDE9726 |
| t[2A] = 296464DB | t[55] = C5BAF3FD | |

Fig. 6b: $T_{400}$[80-FF]

| | | |
|---|---|---|
| t[80] = A6D09E96 | t[AB] = 18C6C006 | t[D6] = DE3D3E01 |
| t[81] = 31A2A4DD | t[AC] = F1DB412E | t[D7] = 494F044A |
| t[82] = 8CF5F7B7 | t[AD] = 66A97B65 | t[D8] = 08C721E6 |
| t[83] = 1B87CDFC | t[AE] = DBFE280F | t[D9] = 9FB51BAD |
| t[84] = F29A4CD4 | t[AF] = 4C8C1244 | t[DA] = 22E248C7 |
| t[85] = 65E8769F | t[B0] = 58EE6357 | t[DB] = B590728C |
| t[86] = D8BF25F5 | t[B1] = CF9C591C | t[DC] = 5C8DF3A4 |
| t[87] = 4FCD1FBE | t[B2] = 72CB0A76 | t[DD] = CBFFC9EF |
| t[88] = 0E453A12 | t[B3] = E5B9303D | t[DE] = 76A89A85 |
| t[89] = 99370059 | t[B4] = 0CA4B115 | t[DF] = E1DAA0CE |
| t[8A] = 24605333 | t[B5] = 9BD68B5E | t[E0] = 5E6C78A3 |
| t[8B] = B3126978 | t[B6] = 2681D834 | t[E1] = C91E42E8 |
| t[8C] = 5A0FE850 | t[B7] = B1F3E27F | t[E2] = 74491182 |
| t[8D] = CD7DD21B | t[B8] = F07BC7D3 | t[E3] = E33B2BC9 |
| t[8E] = 702A8171 | t[B9] = 6709FD98 | t[E4] = 0A26AAE1 |
| t[8F] = E758BB3A | t[BA] = DA5EAEF2 | t[E5] = 9D5490AA |
| t[90] = F33ACA29 | t[BB] = 4D2C94B9 | t[E6] = 2003C3C0 |
| t[91] = 6448F062 | t[BC] = A4311591 | t[E7] = B771F98B |
| t[92] = D91FA308 | t[BD] = 33432FDA | t[E8] = F6F9DC27 |
| t[93] = 4E6D9943 | t[BE] = 8E147CB0 | t[E9] = 618BE66C |
| t[94] = A770186B | t[BF] = 196646FB | t[EA] = DCDCB506 |
| t[95] = 30022220 | t[C0] = F5B8D1DD | t[EB] = 4BAE8F4D |
| t[96] = 8D55714A | t[C1] = 62CAEB96 | t[EC] = A2B30E65 |
| t[97] = 1A274B01 | t[C2] = DF9DB8FC | t[ED] = 35C1342E |
| t[98] = 5BAF6EAD | t[C3] = 48EF82B7 | t[EE] = 88966744 |
| t[99] = CCDD54E6 | t[C4] = A1F2039F | t[EF] = 1FE45D0F |
| t[9A] = 718A078C | t[C5] = 368039D4 | t[F0] = 0B862C1C |
| t[9B] = E6F83DC7 | t[C6] = 8BD76ABE | t[F1] = 9CF41657 |
| t[9C] = 0FE5BCEF | t[C7] = 1CA550F5 | t[F2] = 21A3453D |
| t[9D] = 989786A4 | t[C8] = 5D2D7559 | t[F3] = B6D17F76 |
| t[9E] = 25C0D5CE | t[C9] = CA5F4F12 | t[F4] = 5FCCFE5E |
| t[9F] = B2B2EF85 | t[CA] = 77081C78 | t[F5] = C8BEC415 |
| t[A0] = 0D0437E8 | t[CB] = E07A2633 | t[F6] = 75E9977F |
| t[A1] = 9A760DA3 | t[CC] = 0967A71B | t[F7] = E29BAD34 |
| t[A2] = 27215EC9 | t[CD] = 9E159D50 | t[F8] = A3138898 |
| t[A3] = B0536482 | t[CE] = 2342CE3A | t[F9] = 3461B2D3 |
| t[A4] = 594EE5AA | t[CF] = B430F471 | t[FA] = 8936E1B9 |
| t[A5] = CE3CDFE1 | t[D0] = A0528562 | t[FB] = 1E44DBF2 |
| t[A6] = 736B8C8B | t[D1] = 3720BF29 | t[FC] = F7595ADA |
| t[A7] = E419B6C0 | t[D2] = 8A77EC43 | t[FD] = 602B6091 |
| t[A8] = A591936C | t[D3] = 1D05D608 | t[FE] = DD7C33FB |
| t[A9] = 32E3A927 | t[D4] = F4185720 | t[FF] = 4A0E09B0 |
| t[AA] = 8FB4FA4D | t[D5] = 636A6D6B | |

Fig. 7a: $T_{408}$[00-7F]

| | | |
|---|---|---|
| t[00] = 00000000 | t[2B] = 97EEBD74 | t[56] = 2B1C675F |
| t[01] = 4960209B | t[2C] = 6D0F4302 | t[57] = 627C47C4 |
| t[02] = 92C04136 | t[2D] = 246F6399 | t[58] = DA1E8604 |
| t[03] = DBA061AD | t[2E] = FFCF0234 | t[59] = 937EA69F |
| t[04] = 21419FDB | t[2F] = B6AF22AF | t[5A] = 48DEC732 |
| t[05] = 6821BF40 | t[30] = 8BCB9C03 | t[5B] = 01BEE7A9 |
| t[06] = B381DEED | t[31] = C2ABBC98 | t[5C] = FB5F19DF |
| t[07] = FAE1FE76 | t[32] = 190BDD35 | t[5D] = B23F3944 |
| t[08] = 42833FB6 | t[33] = 506BFDAE | t[5E] = 699F58E9 |
| t[09] = 0BE31F2D | t[34] = AA8A03D8 | t[5F] = 20FF7872 |
| t[0A] = D0437E80 | t[35] = E3EA2343 | t[60] = 135625B1 |
| t[0B] = 99235E1B | t[36] = 384A42EE | t[61] = 5A36052A |
| t[0C] = 63C2A06D | t[37] = 712A6275 | t[62] = 81966487 |
| t[0D] = 2AA280F6 | t[38] = C948A3B5 | t[63] = C8F6441C |
| t[0E] = F102E15B | t[39] = 8028832E | t[64] = 3217BA6A |
| t[0F] = B862C1C0 | t[3A] = 5B88E283 | t[65] = 7B779AF1 |
| t[10] = 85067F6C | t[3B] = 12E8C218 | t[66] = A0D7FB5C |
| t[11] = CC665FF7 | t[3C] = E8093C6E | t[67] = E9B7DBC7 |
| t[12] = 17C63E5A | t[3D] = A1691CF5 | t[68] = 51D51A07 |
| t[13] = 5EA61EC1 | t[3E] = 7AC97D58 | t[69] = 18B53A9C |
| t[14] = A447E0B7 | t[3F] = 33A95DC3 | t[6A] = C3155B31 |
| t[15] = ED27C02C | t[40] = 1D9BC6DE | t[6B] = 8A757BAA |
| t[16] = 3687A181 | t[41] = 54FBE645 | t[6C] = 709485DC |
| t[17] = 7FE7811A | t[42] = 8F5B87E8 | t[6D] = 39F4A547 |
| t[18] = C78540DA | t[43] = C63BA773 | t[6E] = E254C4EA |
| t[19] = 8EE56041 | t[44] = 3CDA5905 | t[6F] = AB34E471 |
| t[1A] = 554501EC | t[45] = 75BA799E | t[70] = 96505ADD |
| t[1B] = 1C252177 | t[46] = AE1A1833 | t[71] = DF307A46 |
| t[1C] = E6C4DF01 | t[47] = E77A38A8 | t[72] = 04901BEB |
| t[1D] = AFA4FF9A | t[48] = 5F18F968 | t[73] = 4DF03B70 |
| t[1E] = 74049E37 | t[49] = 1678D9F3 | t[74] = B711C506 |
| t[1F] = 3D64BEAC | t[4A] = CDD8B85E | t[75] = FE71E59D |
| t[20] = 0ECDE36F | t[4B] = 84B898C5 | t[76] = 25D18430 |
| t[21] = 47ADC3F4 | t[4C] = 7E5966B3 | t[77] = 6CB1A4AB |
| t[22] = 9C0DA259 | t[4D] = 37394628 | t[78] = D4D3656B |
| t[23] = D56D82C2 | t[4E] = EC992785 | t[79] = 9DB345F0 |
| t[24] = 2F8C7CB4 | t[4F] = A5F9071E | t[7A] = 4613245D |
| t[25] = 66EC5C2F | t[50] = 989DB9B2 | t[7B] = 0F7304C6 |
| t[26] = BD4C3D82 | t[51] = D1FD9929 | t[7C] = F592FAB0 |
| t[27] = F42C1D19 | t[52] = 0A5DF884 | t[7D] = BCF2DA2B |
| t[28] = 4C4EDCD9 | t[53] = 433DD81F | t[7E] = 6752BB86 |
| t[29] = 052EFC42 | t[54] = B9DC2669 | t[7F] = 2E329B1D |
| t[2A] = DE8E9DEF | t[55] = F0BC06F2 | |

Fig. 7b: $T_{408}$[80-FF]

| | | |
|---|---|---|
| t[80] = 3B378DBC | t[AB] = ACD930C8 | t[D6] = 102BEAE3 |
| t[81] = 7257AD27 | t[AC] = 5638CEBE | t[D7] = 594BCA78 |
| t[82] = A9F7CC8A | t[AD] = 1F58EE25 | t[D8] = E1290BB8 |
| t[83] = E097EC11 | t[AE] = C4F88F88 | t[D9] = A8492B23 |
| t[84] = 1A761267 | t[AF] = 8D98AF13 | t[DA] = 73E94A8E |
| t[85] = 531632FC | t[B0] = B0FC11BF | t[DB] = 3A896A15 |
| t[86] = 88B65351 | t[B1] = F99C3124 | t[DC] = C0689463 |
| t[87] = C1D673CA | t[B2] = 223C5089 | t[DD] = 8908B4F8 |
| t[88] = 79B4B20A | t[B3] = 6B5C7012 | t[DE] = 52A8D555 |
| t[89] = 30D49291 | t[B4] = 91BD8E64 | t[DF] = 1BC8F5CE |
| t[8A] = EB74F33C | t[B5] = D8DDAEFF | t[E0] = 2861A80D |
| t[8B] = A214D3A7 | t[B6] = 037DCF52 | t[E1] = 61018896 |
| t[8C] = 58F52DD1 | t[B7] = 4A1DEFC9 | t[E2] = BAA1E93B |
| t[8D] = 11950D4A | t[B8] = F27F2E09 | t[E3] = F3C1C9A0 |
| t[8E] = CA356CE7 | t[B9] = BB1F0E92 | t[E4] = 092037D6 |
| t[8F] = 83554C7C | t[BA] = 60BF6F3F | t[E5] = 4040174D |
| t[90] = BE31F2D0 | t[BB] = 29DF4FA4 | t[E6] = 9BE076E0 |
| t[91] = F751D24B | t[BC] = D33EB1D2 | t[E7] = D280567B |
| t[92] = 2CF1B3E6 | t[BD] = 9A5E9149 | t[E8] = 6AE297BB |
| t[93] = 6591937D | t[BE] = 41FEF0E4 | t[E9] = 2382B720 |
| t[94] = 9F706D0B | t[BF] = 089ED07F | t[EA] = F822D68D |
| t[95] = D6104D90 | t[C0] = 26AC4B62 | t[EB] = B142F616 |
| t[96] = 0DB02C3D | t[C1] = 6FCC6BF9 | t[EC] = 4BA30860 |
| t[97] = 44D00CA6 | t[C2] = B46C0A54 | t[ED] = 02C328FB |
| t[98] = FCB2CD66 | t[C3] = FD0C2ACF | t[EE] = D9634956 |
| t[99] = B5D2EDFD | t[C4] = 07EDD4B9 | t[EF] = 900369CD |
| t[9A] = 6E728C50 | t[C5] = 4E8DF422 | t[F0] = AD67D761 |
| t[9B] = 2712ACCB | t[C6] = 952D958F | t[F1] = E407F7FA |
| t[9C] = DDF352BD | t[C7] = DC4DB514 | t[F2] = 3FA79657 |
| t[9D] = 94937226 | t[C8] = 642F74D4 | t[F3] = 76C7B6CC |
| t[9E] = 4F33138B | t[C9] = 2D4F544F | t[F4] = 8C2648BA |
| t[9F] = 06533310 | t[CA] = F6EF35E2 | t[F5] = C5466821 |
| t[A0] = 35FA6ED3 | t[CB] = BF8F1579 | t[F6] = 1EE6098C |
| t[A1] = 7C9A4E48 | t[CC] = 456EEB0F | t[F7] = 57862917 |
| t[A2] = A73A2FE5 | t[CD] = 0C0ECB94 | t[F8] = EFE4E8D7 |
| t[A3] = EE5A0F7E | t[CE] = D7AEAA39 | t[F9] = A684C84C |
| t[A4] = 14BBF108 | t[CF] = 9ECE8AA2 | t[FA] = 7D24A9E1 |
| t[A5] = 5DDBD193 | t[D0] = A3AA340E | t[FB] = 3444897A |
| t[A6] = 867BB03E | t[D1] = EACA1495 | t[FC] = CEA5770C |
| t[A7] = CF1B90A5 | t[D2] = 316A7538 | t[FD] = 87C55797 |
| t[A8] = 77795165 | t[D3] = 780A55A3 | t[FE] = 5C65363A |
| t[A9] = 3E1971FE | t[D4] = 82EBABD5 | t[FF] = 150516A1 |
| t[AA] = E5B91053 | t[D5] = CB8B8B4E | | ság
METHOD AND APPARATUS FOR VERIFYING CRC CODES

This is a continuation of application Ser. No. 08/189,319 filed Jan. 31, 1994 now abandoned.

TECHNICAL FIELD

This invention relates to methods and apparatus for verifying cyclic redundancy check (CRC) codes.

BACKGROUND ART

CRC codes are used extensively in digital data communications for detection of errors which can occur during the communications process. Typically a message to be communicated is assembled and encoded in binary digital form, and a CRC code is derived from it using a predetermined algorithm together with a predetermined multi-bit number. One particular number in widespread use for this purpose can be represented by the following polynomial of degree thirty-two:

$$g(x)=x^{32}+x^{26}+x^{23}+x^{22}+x^{16}+x^{12}+x^{11}+x^{10}+x^8+x^7+x^5+x^4+x^2+x+1. \quad (1)$$

In one implementation of this technique, a 32-stage shift register is provided with an exclusive-OR gate at its output (stage 31, numbering from zero) to add the output signal, modulo 2, to successive bits of the message to be communicated, in synchronism with shifting of the contents of the register. The output of this exclusive-OR gate is fed directly to the first stage (stage 0), and to further exclusive-OR gates coupling each of the remaining stages corresponding to the terms of g(x) (that is stages 26, 23, . . . , 2 and 1) to its preceding stage (see FIG. 1). The shift register is initially loaded with all ones, and then receives the message to be communicated as described; when the whole message has been input, the contents of the shift register are output and inverted to produce the CRC code, which is conventionally appended to the message. Upon reception the message and its appended CRC code are input in the same manner into a similarly-arranged shift register pre-loaded with all ones; when the whole message and the CRC code have been input, the shift register should contain the binary value 1100 0111 0000 0100 1101 1101 0111 1011 ($C704DD7B_H$), corresponding to the remainder of dividing the polynomial $x^{63}+x^{62}+ \ldots +x^{33}+x^{32}$ by the polynomial g(x). If any other value results, the message has sustained one or more errors.

Although such an implementation is effective and reliable, there are circumstances where it is disadvantageous. One technique currently being implemented for high-speed data transfer is known as Asynchronous Transfer Mode (ATM). In implementations of ATM for 'local' use, e.g. within buildings, a single message may be relatively large (up to 65568 bytes for example). For transmission purposes, this message is padded to an exact multiple of 48 bytes in length and then split into consecutive 48-byte segments. Although in accordance with the ATM protocol these segments are received in the same order in which they are transmitted, they may be interspersed with segments from other transmissions, intended for the same or another recipient.

One possible approach to verifying the CRC code for the received message would be to derive the CRC verification result as part of general processing of the message. However, such processing is typically carried out by data processing equipment under software program control, imposing a serious time penalty on the speed of processing of each message.

In principle it would be possible to derive the CRC verification result for each message in real time by supplying its successive segments to a shift register as they are received; interspersed segments for other messages could be handled either by providing an individual shift register for each distinct message, or by saving and restoring the contents of the shift register each time a segment for a different message is received. However, the first option is very expensive in terms of circuit hardware, while the second imposes an undesirable delay as the current contents of the shift register for one message and the message's identity are saved, and the message whose next segment has arrived is identified and the previously-saved contents for that message are retrieved and loaded into the register. Furthermore, both approaches require setting some arbitrary limit to the number of different messages which may be received simultaneously.

DISCLOSURE OF INVENTION

According to one aspect of this invention there is provided a method of verifying a CRC code relating to a block of data transferred as a plurality of sub-blocks via a communications medium, comprising the steps of:

deriving, from a predetermined initializing value, a respective partial CRC code for each received sub-block of data;

combining said partial CRC codes to derive a CRC verification value for the complete data block as received; and testing validity of said verification value for the complete received data block.

Using this method a separate partial CRC code is derived for each ATM segment and saved in association with it; the starting value for CRC code generation (e.g. the contents of the shift register described above) is then reset to a predetermined initializing value (e.g. all zeroes). Subsequently the partial CRC codes for all the segments comprising a complete message are combined, as described herein, to derive a CRC verification value which relates to the complete message and which can be used to check whether the message has been affected by errors. The derivation of the partial CRC codes can conveniently be accomplished at high speed in dedicated hardware circuitry, whilst the combination of partial CRC codes can be accomplished using circuitry under software program control without incurring a serious time penalty. With this invention there is no need to identify which message a segment belongs to as part of the partial CRC code derivation, and there is no limit in principle to the number of messages which may be received simultaneously.

According to another aspect of this invention apparatus for verifying a CRC code relating to a block of data transferred as a plurality of sub-blocks via a communications medium, comprises:

means for deriving, from a predetermined initializing value, a respective partial CRC code for each received sub-block of data;

means for combining said partial CRC codes to derive a CRC verification value for the complete data block as received; and means for testing validity of said verification value for the complete received data block.

BRIEF DESCRIPTION OF DRAWINGS

A method and apparatus in accordance with this invention for verifying CRC codes will now be described, by way of example, with reference to the accompanying drawings, in which:

FIGS. 4a to 7b are look-up tables of hexadecimal values used in the procedure of FIG. 3.

BEST MODE FOR CARRYING OUT THE INVENTION, & INDUSTRIAL APPLICABILITY

Figure 2:
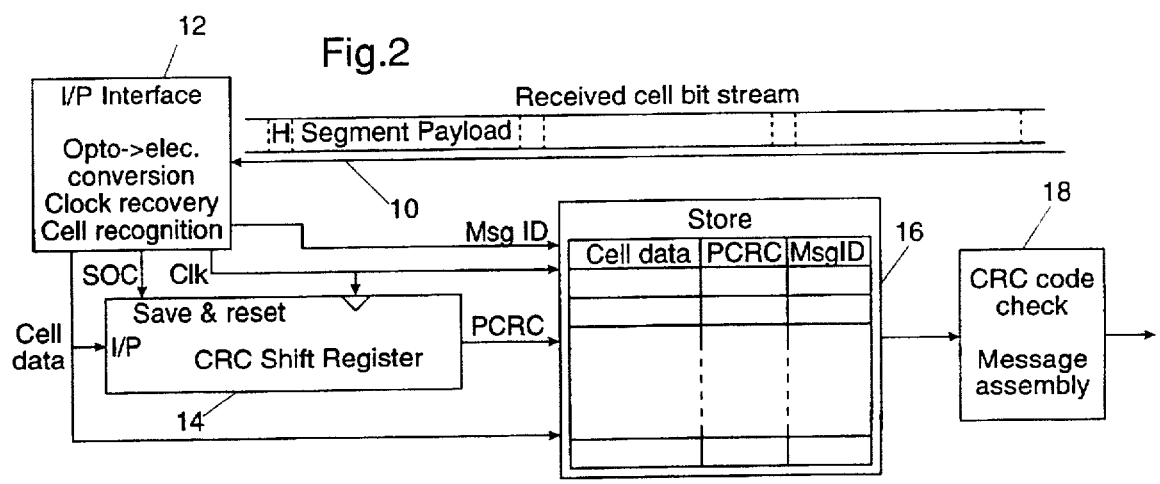
FIG. 2 is a block diagram of apparatus for verifying CRC codes in accordance with this invention.

Referring to FIG. 2, apparatus for receiving an ATM data stream on an optical fibre input line 10 and for verifying CRC codes of messages in the data stream has an input interface 12 coupled to the line 10. As shown in FIG. 2, the ATM data stream is treated as comprising a sequence of cells, each cell having a five-byte header H which carries system operating information and a 48-byte payload comprising one segment of a complete ATM message. Successive cells may contain segments for different messages, and the identity of the message to which a segment belongs is included in the information in the header H of the cell containing that segment.

The input interface 12 converts the signal from the line 10 from optical form to electrical form, produces a data signal containing the segment data in each cell, produces a clock signal synchronized with the occurrence of binary digits in the signal (clock recovery), locates the boundaries between ATM cells in the received data stream to produce a start-of-cell (SOC) signal, and extracts from the cell header the identity of the message to which each segment belongs. Techniques and circuitry for performing these functions are well known to those skilled in the art and do not form part of this invention, and so will not be described here.

Figure 1:
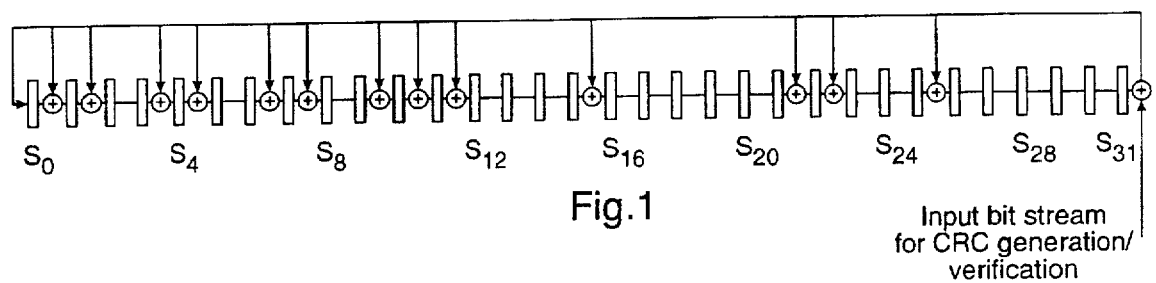
FIG. 1 shows a shift register for deriving a CRC code based on the polynomial g(x)

The data signal, clock signal and SOC signal are supplied to a 32-bit shift register 14 arranged to implement a CRC code as described above and as shown in FIG. 1. In addition to the connections shown in FIG. 1, the shift register 14 has two further inputs: a clock input which receives the clock signal and synchronizes shifting of data through the register; and a control input which receives the SOC signal and causes the current contents of the shift register to be output (saved) and the shift register to be reset to a predetermined initializing value of all zeroes. Implementation of these inputs will also be evident to those skilled in the art.

The output of the shift register 14 is coupled to a store 16 which also receives the data signal, clock signal and message identity from the input interface 12. When an SOC signal occurs the current contents of the shift register 14 (a 'partial' CRC code, PCRC) are output to the store 16 which stores them in conjunction with the corresponding segment data and the identity of the message (MsgID) to which that segment belongs. The store 16 may have as large a capacity as desired, typically several thousands of segments and associated PCRC's and MsgID's.

Although the derivation of partial CRC codes by the shift register 14 and the transfer of data through the circuitry have been described and illustrated in terms of serial techniques for the sake of clarity, it will be understood by those skilled in the art that these operations may equally be implemented using parallel mechanisms to operate on several bits simultaneously if desired.

When all the segments comprising a message have been received, the complete message is assembled and its CRC code is verified by a verification device 18. This device may conveniently be implemented by means of a data processor unit controlled by an appropriate software program; the data processor unit may also be used to implement further processing of the received messages, for example in accordance with higher-level communication protocols.

Figure 3:
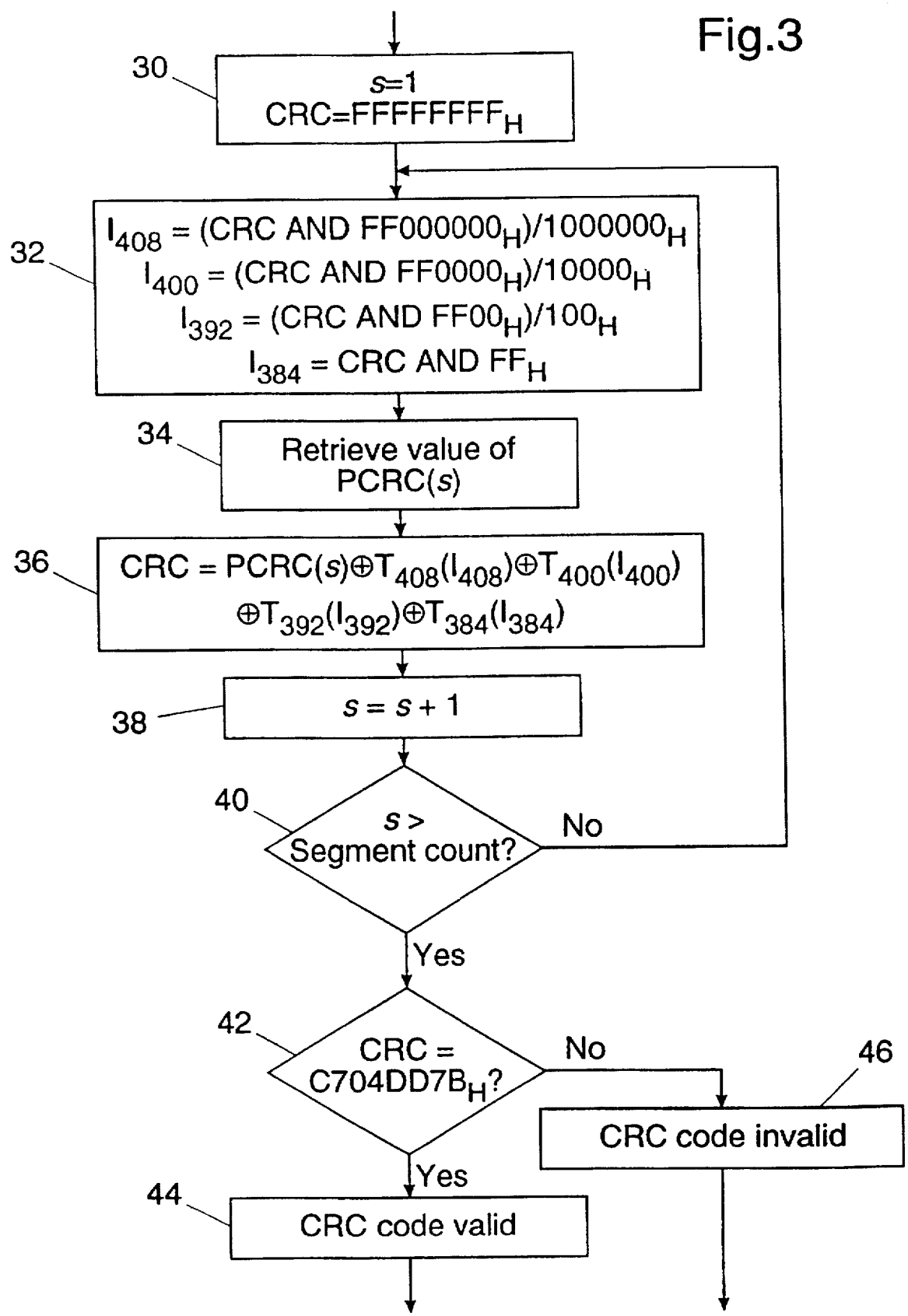
FIG. 3 is a flow chart of a procedure implemented in part of the apparatus of FIG. 2.

The verification device 18 extracts from the store 16 the PCRC for each segment having the MsgID for that message, and combines it with the PCRC's for the other segments of the message in accordance with the procedure shown in FIG. 3.

Referring to FIG. 3, the procedure starts at step 30 by setting a counter s equal to one, and initializing a four-byte hexadecimal variable CRC to a value of $\text{FFFFFFFF}_H$.

At the next step 32 the procedure derives a value for an index I into each of four look-up tables in accordance with the values of respective bytes of the variable CRC. Thus an index $I_{408}$ is set equal to the value of the most significant byte of CRC, an index $I_{400}$ is set equal to the second most significant byte, an index $I_{392}$ is set equal to the third most significant byte and an index $I_{384}$ is set equal to the least significant byte.

Each look-up table has 256 entries, the values of which will depend upon the particular polynomial upon which the CRC code algorithm is based and can be calculated as described hereinafter. A set of tables $T_{384}$, $T_{392}$, $T_{400}$ and $T_{408}$ for the polynomial g(x) are given in FIGS. 4a to 7b.

At step 34 the procedure retrieves the value of the PCRC for segment s, the segments being numbered in the order in which they were received; thus the first PCRC retrieved (s=1) is for the most significant segment, which is the first segment to be received; the last segment retrieved is the least significant segment, for s equal to the total number of segments in the message.

An updated value for CRC is derived at step 36, in accordance with the relationship $$\text{CRC}=\text{PCRC}(s)\oplus T_{408}(I_{408})\oplus T_{400}(I_{400})\oplus T_{392}(I_{392})\oplus T_{384}(I_{384}) \quad (2)$$

where $\oplus$ indicates a bit-wise exclusive-OR operation and $T_{408}(I_{408})$ indicates the entry in the table $T_{408}$ for the current value of the index $I_{408}$.

The value of s is incremented by one at step 38, and the incremented value is tested at step 40. If s is less than or equal to the total number of segments in the message, the procedure returns to step 32 to derive new values for the indexes $I_{384}$, $I_{392}$, $I_{400}$ and $I_{408}$ in accordance with the respective bytes comprising the updated value of CRC.

If the incremented value of s is greater than the total number of segments in the message the value of CRC is the CRC verification value for the complete message. This is tested at step 42 for equality with the expected value of $\text{C704DD7B}_H$ for an error-free message. If CRC has this value, then a valid CRC code is indicated at step 44; otherwise an invalid CRC code, and therefore the occurrence of one or more errors in the received message, is indicated at step 46. In the latter case appropriate steps would be taken, such as requesting retransmission of the message, depending on the particular communication protocol being used.

Although the procedure of FIG. 3 has been described in the context of completing reception of an entire message before derivation of the overall CRC verification value commences, it should be noted that the procedure may equally be applied to derivation of the CRC verification value contemporaneously with reception of each successive segment.

By way of example, a three-segment message and appended CRC code may be received having successive segments with partial CRC's derived by the shift register 14 as follows:

$$PCRC(1) = A07C4DD8_H$$

$$PCRC(2) = 072FEB03_H$$

$$PCRC(3) = 2E24F35D_H.$$

The values of $I_{384}$, $I_{392}$, $I_{400}$ and $I_{408}$ for the initial value of CRC of $FFFFFFFF_H$ are $$I_{384} = I_{392} = I_{400} = I_{408} = FF_H$$

for which the look-up table entries are $$T_{384} = 580FA91E_H, T_{392} = 513658BF_H, T_{400} = 4A0E09B0_H \text{ and } T_{408} = 150516A1_H.$$

The first calculation of CRC at step 36 yields $$CRC = A07C4DD8 \oplus 580FA91E \oplus 513658BF \oplus 4A0E09B0 \oplus 150516A1 = F64EA368_H.$$

The next values of $I_{384}$, $I_{392}$, $I_{400}$ and $I_{408}$ are $$I_{384} = 68_H, I_{392} = A3_H, I_{400} = 4E_H \text{ and } I_{408} = F6_H$$

and the look-up table entries are $$T_{384} = 267A5A62_H, T_{392} = D5B60D44_H, T_{400} = 859250AC_H \text{ and } T_{408} = 1EE6098C_H.$$

So the next calculation of CRC at step 36 yields $$CRC = 072FEB03 \oplus 267A5A62 \oplus D5B60D44 \oplus 859250AC \oplus 1EE6098C = 6F97E505_H.$$

The new values of $I_{384}$, $I_{392}$, $I_{400}$ and $I_{408}$ are therefore $$I_{384} = 05_H, I_{392} = E5_H, I_{400} = 97_H \text{ and } I_{408} = 6F_H$$

and the corresponding look-up table entries are $$T_{384} = B55AB166_H, T_{392} = ED693030_H, T_{400} = 1A274B01_H \text{ and } T_{408} = AB34E471_H.$$

So the final calculation of CRC at step 36 yields $$CRC = 2E24F35D \oplus B55AB166 \oplus ED693030 \oplus 1A274B01 \oplus AB34E471 = C704DD7B_H.$$

This is the expected value for CRC verification, so the CRC process does not indicate any transmission errors.

The look-up tables $T_{384}$, $T_{392}$, $T_{400}$ and $T_{408}$ contain values calculated according to the following relationships, for $0 \leq i < 256$:

$$T_{384}[i] = (x^{384} i(x)) \bmod g(x) \quad (3)$$

$$T_{392}[i] = (x^{392} i(x)) \bmod g(x) \quad (4)$$

$$T_{400}[i] = (x^{400} i(x)) \bmod g(x) \quad (5)$$

$$T_{408}[i] = (x^{408} i(x)) \bmod g(x) \quad (6)$$

where $i(x)$ is the polynomial corresponding to the eight-bit value i. The following routine in C program code may be used for this purpose:

```
#define MASK 0x80000000L    /* mask for most significant bit */
#define P 0x04c11db7L       /* Generator polynomial g(x) = x^{32} +
                               P(x) */
void table( );
unsigned long   x_power ( );
main( )
{
    unsigned long  t384[256], t392[256], t400[256], t408[256];
    unsigned long  h384;
    /* Set h384(x) = x^{384} mod g(x) */
    h384 = x_power(384, 1);
    /* Make look-up tables for x^{j}i(x) mod (g(x) for all 8-bit i
       and j = 384, 392, 400, 408 */
    table(t384, h384);
    table(t392, x_power(8, h384));
    table(t400, x_power(16, h384));
    table(t408, x_power(24, h384));
}
/* Makes look-up table for h(x)i(x) mod g(x) for all 8-bit i (h is 32 bits)
*/
void  table(t, h)
unsigned long   t[256], h;
{
    int    u, i, k;
    unsigned long   x_table[8];
    unsigned long   mask;
    /* Set x_table[u] = h(x)x^{u} mod g(x) for 0 <= u < 8 */
    x_table[0] = h;
    for (u=1; u<8; u++)
        x_table[u] = x_power(1, x_table[u-1]);
    /* Set t[i] = h(x)i(x) mod g(x) for all 8-bit i */
    for (i=0; i<256; i++)
    {
        t[i] = 0;
        /* Pick out terms h(x)x^{u} mod g(x) from x_table[ ]
           according to positions of 1's in i */
        for (mask=1, k=0; k<8; mask<<=1, k++)
            if (i & mask)
                t[i] ^= x_table[k];
    }
}
/* Returns (x^{r} h(x)) mod g(x) */
unsigned long   x_power(r, h)
int   r;
unsigned long   h;
{
    int   i;
    for (i=1; i<=r; i++)
    {
        /* Shift h left once, XOR with P if most sig bit was 1 */
        if (h & MASK)
            h = (h << 1) ^ P;
        else
            h <<= 1;
    }
    return(h);
}
```

I claim:

1. A method of verifying a CRC code for a data block transferred as a plurality of segmented sub-blocks via a communications medium, said CRC code including a remainder after division by a predetermined polynomial of an operand derived from said data block, said method comprising the steps of:

deriving a respective partial CRC code for a first received sub-block of data, from a predetermined initializing value and using said predetermined polynomial;

deriving a respective partial CRC code for each subsequent received sub-block of data, from said predetermined initializing value and using said predetermined polynomial, segmentally independent of any partial CRC code derived from any preceding sub-block of data;

combining said partial CRC codes to derive a CRC verification value for the data block transferred as a plurality of sub-blocks and which is indicative of whether the data block transferred is consistent with a CRC code which would be derived using said predetermined polynomial for said data block considered as a whole; and testing validity of said CRC verification value for the data block transferred.

2. The method of claim 1, wherein the step of deriving a respective partial CRC code for a first received sub-block of data and the step of deriving a respective partial CRC code for each subsequent received sub-block of data each include the step of using hardware circuitry dedicated to derivation, and the step of combining said partial CRC codes to derive the CRC verification value for the data block transferred includes the step of using general-purpose hardware circuitry controlled by program instructions to combine the partial CRC codes.

3. The method of claim 1, wherein said partial CRC codes are derived by:

presetting a shift register with said initializing value, said shift register having feedback via exclusive-OR gates from its output to predetermined shift register stages;

shifting one data sub-block into said shift register; and storing the resulting contents of said shift register.

4. The method of claim 1, wherein said initializing value is zero.

5. The method of claim 1, wherein said CRC verification value is derived by combining the partial CRC code for a second sub-block of data and the partial CRC code for each subsequent sub-block of data with one or more values selected from one or more predetermined tables in accordance with a result of such combining step for a preceding partial CRC code, a value or values for combination with the partial CRC code for the first received sub-block of data being selected from said table or tables in accordance with a predetermined starting value.

6. The method of claim 5, wherein there are a plurality of predetermined tables and values are selected from said predetermined tables in accordance with values of respective portions of a result of said combining step for a preceding partial CRC code or of said predetermined starting value.

7. The method of claim 6, wherein said partial CRC codes and said table or tables are stored as hexadecimal values, said respective portions are adjacent pairs of hexadecimal digits, and said combining step is performed using bit-wise modulo 2 addition.

8. Apparatus for verifying a CRC code for a data block transferred as a plurality of segmented sub-blocks via a communications medium, said CRC code including a remainder after division by a predetermined polynomial of an operand derived from said data block, said apparatus comprising:

means for deriving a respective partial CRC code for a first received sub-block of data, from a predetermined initializing value and using said predetermined polynomial;

means for deriving a respective partial CRC code for each subsequent received sub-block of data, from said predetermined initializing value and using said predetermined polynomial, and segmentally independent of any partial CRC code derived from any preceding sub-block of data;

means for combining said partial CRC codes to derive a CRC verification value for the data block transferred as a plurality of sub-blocks and which is indicative of whether the data block transferred is consistent with a CRC code which would be derived using said predetermined polynomial for said data block considered as a whole; and means for testing validity of said CRC verification value for the data block transferred.

9. The apparatus of claim 8, comprising hardware circuity dedicated to derivation of said partial CRC codes, and general-purpose hardware circuitry controlled by program instructions for deriving the CRC verification value for the data block transferred.

* * * * *